United States Patent [19]

Johnson et al.

[11] 4,256,052
[45] Mar. 17, 1981

[54] TEMPERATURE GRADIENT MEANS IN REACTOR TUBE OF VAPOR DEPOSITION APPARATUS

[75] Inventors: Raymond V. Johnson, Tequesta; Dennis P. Biondi, Palm Beach Gardens, both of Fla.

[73] Assignee: RCA Corp., New York, N.Y.

[21] Appl. No.: 81,193

[22] Filed: Oct. 2, 1979

[51] Int. Cl.³ ............... C23C 13/08; F27D 15/02; F27D 13/00; B05C 5/00

[52] U.S. Cl. .................. 118/719; 118/724; 432/65; 432/83

[58] Field of Search ............ 118/715, 719–733, 118/900; 148/175, 189; 427/83–87, 91, 166, 167

[56] References Cited

U.S. PATENT DOCUMENTS

| | | | |
|---|---|---|---|
| 1,965,059 | 7/1934 | Seibt | 118/730 |
| 3,086,882 | 4/1963 | Smith, Jr. et al. | 427/166 X |
| 3,183,131 | 5/1965 | Huffman | 148/189 |
| 3,672,948 | 6/1972 | Foehring et al. | 118/719 X |
| 3,828,722 | 8/1974 | Reuter et al. | 118/729 X |
| 3,893,876 | 7/1975 | Akai et al. | 118/729 X |
| 4,129,090 | 12/1978 | Inaniwa et al. | 118/728 |

OTHER PUBLICATIONS

*IBM Technical Disclosure Bulletin*, vol. 15, No. 2, Jul. 1972, Benjamin, C. F. "Plug-Type Vacuum Diffusion System", pp. 414–415.
*IBM Technical Disclosure Bulletin*, vol. 16, No. 4, pp. 1220–1221, Zirinsky, "Retort for Pyrolytic Vapor Deposition of Thin Films".

*Primary Examiner*—Morris Kaplan
*Attorney, Agent, or Firm*—Birgit E. Morris; D. S. Cohen; Lawrence P. Benjamin

[57] ABSTRACT

A diffusion furnace having particular utility in the processing of SOS devices wherein a temperature gradient, per unit length of furnace tube, is provided at a section of a reaction tube extending between the furnace and the scavenger and load-unload chambers in order to minimize the thermal shock to which a sapphire wafer may be subject, either at the commencement of processing when the wafer is first introduced into the furnace or at the conclusion of the processing as the wafer is being withdrawn from the furnace.

2 Claims, 3 Drawing Figures

TEMPERATURE GRADIENT MEANS IN REACTOR TUBE OF VAPOR DEPOSITION APPARATUS

This invention relates to the fabrication of semiconductor devices and more particularly to the fabrication of silicon-on-sapphire (SOS) semiconductor devices.

An SOS semiconductor device is an active device formed on a sapphire substrate. The present practice is to form islands of silicon, about 0.5–0.6 $\mu$m thick, on a smooth surface of a wafer of sapphire, spinel or monocrystalline beryllium oxide and then further processing the silicon islands by forming the traditional drain, source and gate members therein. SOS devices are a particularly attractive tool for the large scale integrated (LSI) circuit designer in that it has a high packing density due to the natural isolation from one island to another which results from use of the insulating sapphire substrate. In the fabrication of SOS devices, the individual circuits are first formed on a larger wafer which is then separated to form small chips which chips, inturn, are then mounted for use in a system.

However, as distinguished from the more traditional methods utilized in the formation of bulk silicon devices, it has been found that certain bulk silicon processing procedures, which heretofore have been used to fabricate SOS devices, cannot be utilized if one is to protect the integrity of an SOS device and to increase its yield. Specifically, sapphire wafers tend to be more sensitive to thermal shock than bulk silicon wafers and processing systems must be devised specifically for SOS wafers that can accommodate the thermal sensitivity of SOS wafers.

In accordance with the teachings of our invention a diffusion furnace is described having particular utility in the processing of SOS devices wherein a temperature gradient, per unit length of furnace tube, is introduced into the system that minimizes the thermal shock to which a sapphire wafer may be subject prior to the time the wafer is introduced into the furnace tube, at the commencement of processing. It is also been found that the temperature gradient utilized at the commencement of processing also serves to minimize any thermal shock to the wafer when the wafer is withdrawn from the furnace at the discontinuation of the processing step.

Figure 1:
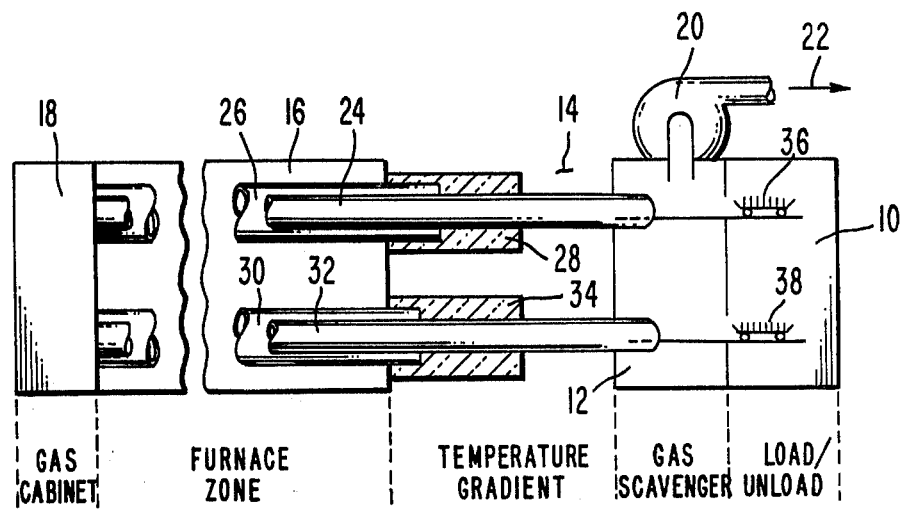
FIG. 1 is a schematic representation of a typical furnace system utilized to process semiconductor devices and indicating the placement of our novel temperature gradient region introduced therein.

Referring now to FIG. 1 there is shown a schematic representation of a typical furnace system having a load/unload station 10 adjacent a gas scavenger station 12. In the prior art furnace systems, the gas scavenger station is typically adjacent furnace zone 16 in order to remove the reactants used in the various processing steps. However, as will be described later, scavenger system 12 and furnace zone 16 in our novel system are separated by gradient zone 14. Adjacent the far end of furnace zone 16 is a gas cabinet 18 in which is stored the various gases and reactants utilized in the process. For example, nitrogen, hydrogen, oxygen, etc. may be introduced into the various furnace tubes 24 and 32 from tanks or sources (not shown) in cabinet 18. Traditionally this is done in controlled amounts at various times, as dictated by the process. Furnace tubes 24 and 32 are typically quartz tubes while liners 26 and 30 are of some refractory material. Both the tubes and the liners have to retain their physical shape and chemical identity in the presence of high temperatures and reactants.

In operation, wafers are mounted on boats 36, 38 at the load/unload station 10 for introduction into furance tubes 24 and 32 respectively. Since the gases and reactants are introduced, from cabinet 18, under pressure into furnace tubes 24 and 32 and since both furnace tubes 24 and 32 terminate in scavenger chamber 12 it will be seen that furnace tubes 24 and 32 are under positive pressure. To prevent these gases from exhausting into the room through scavenger chamber 12, the gases are exhausted by means of exhaust fan 20 to the outside atmosphere, as indicated by arrow 22. Thus, since scavenger chamber 12 is under a negative pressure it is also at a slightly elevated temperature with respect to the room temperature, and exhaust fan 20 removes any heat escaping from furnace tubes 24 and 32. Thus, the wafers are provided with additional cooling before being brought out into the still lower room temperature. In operation, boats 36, 38, containing sapphire wafers, are introduced into furnace tubes 24 and 32 at a temperature slightly above room temperature. Depending upon the speed at which boats 36 and 38 move into furnace tubes 24 and 32 will determine the initial temperature to which sapphire wafers are subjected. As soon as boats 36 and 38 enter furnace tubes 24 and 32 respectively, they are subjected to a slightly elevated temperature with respect to the room temperature but considerably lower than the temperature of furnace 16. Depending upon the particular temperatures being used and the speed at which the boats are introduced into the furnace 16 will determine the amount of insulation 28 and 34 to be utilized in order to provide the proper temperature gradient. As illustrated in FIG. 1, furnace liner 26 extends further into gradient zone 14 than liner 30. This difference in length is utilized to illustrate the differences in temperature that one may expect when utilizing differenet processing procedures. For example, one may be utilizing the temperature of about 900°–1000° in furnace tube 24 but only using about 700° in furnace tube 32. In such a situation, the temperature gradient, in the two tubes, may be tailored to provide a similar temperature gradient to boats 36 and 38.

By way of example when using a processing temperature of about 850°–900° C. and an introduction/removal boat speed of about 2 inches (50.8 mm)/min, we have found that if temperature gradient zone 14, between scavenger 12 and furnace 16, has a length of about 18–20 inches (457.2–508 mm), one would utilize a layer of insulation 28 of about 1 inch (25.4 mm) thick by 6 (152.4 mm) inches wide. One such insulation material 28 which has been found to provide satisfactory results is labelled "FIBERFRAX DURABACK INSULATION" and is made by Carborundum Co., Niagara Falls, N.Y. Under these circumstances, sapphire wafers are subjected to the minimal thermal shock and will thus produce the least amount of breakage. In the above-mentioned circumstances it is not necessary to extend the furnace liner 26 or 30 into the gradient zone 14.

Figure 2A:
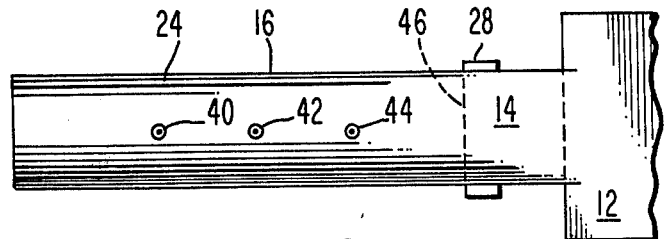
FIG. 2a is a schematic representation of a typical furnace system illustrating the placement of thermocouple probes used for the measurement of the temperature gradient produced by our novel system.
Figure 2B:
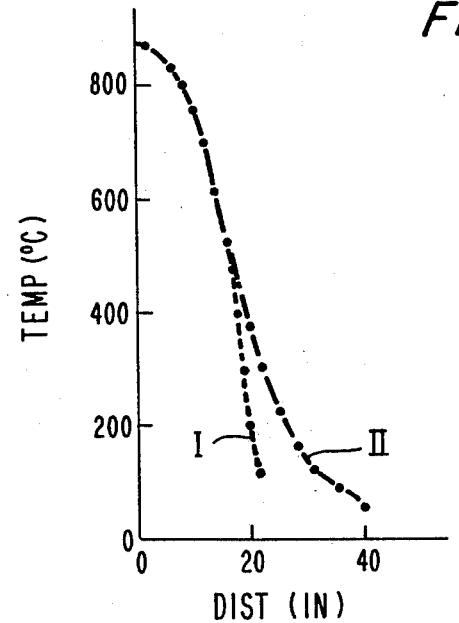
FIG. 2b is graph comparing the temperature gradient in the apparatus of the invention with that of prior art systems.

Referring now to FIGS. 2a and 2b there is shown a typical furnace wystem using our invention (FIG. 2a) together with the temperature profile (FIG. 2b). In FIG. 2a a furnace tube 24 having a length of about 80.5 inches and a diameter of about 4 5/32 inches (105 mm) is provided with thermocouples 40, 42 and 44 positioned about 17 inches (431.8 mm) apart. Thermal couple 40 is positioned about 26½ inches (673.1 mm) from the rear of furnace tube 24 while thermocouple 44 is positioned 20 inches (508 mm) from broken line 46 which line represents the end of a prior art furnace tube. An extension having the same inside dimension as the furnace tube is added to furnace tube 24 and constitutes gradient zone 14. The gradient zone 14 or extension furnace tube 24 is inserted between furnace zone 16 and scavenger zone 12 and is provided with insulation sleeve 28, as previously described.

The efficacy of our system to reduce breakage and thus increase yields was verified by inserting boat 36 (FIG. 1), having wafers thereon, into furnace tube 24 and into the area between thermocouples 40 and 44. Thereafter, the normal processing was performed on the wafers and at the conclusion of processing the boat was withdrawn, at the rate of 2 inches (50.8 mm)/minute. Various measurements were taken of temperature and boat position after the loaded boat passed thermocouple 44 but before it entered scavenger zone 12. These curves are the plotted curves in the graph of FIG. 2b. The curve labelled II is the plot of temperature versus distance from thermocouple 44 as the boat as being withdrawn from a furnace tube toward broken line 46 in a furnace system with no gradient zone. The curve labelled I is the plot of temperature versus distance from the thermocouple 44 as the boat was being withdrawn from furnace tube 24 that was provided with the gradient zone 14 of our invention. The following chart presents the actual measured values that were plotted as curves I and II respectively in FIG. 2b. The data presented in the column labelled "DIST (in)" is the distance, in inches, beyond thermocouple 44.

| DIST. (in) | TEMP. (°C.) I | TEMP. (°C.) II |
|---|---|---|
| 0 | 870 | 870 |
| 2 | 870 | 870 |
| 4 | 860 | 860 |
| 6 | 835 | 835 |
| 8 | 805 | 805 |
| 10 | 760 | 760 |
| 12 | 700 | 700 |
| 14 | 615 | 615 |
| 16 | 530 | 530 |
| 18 | 460 | 400 |
| 19 | 425 | 300 |
| 20 | 359 | 200 |
| 22 | 325 | 115 |
| 24 | 260 | |
| 26 | 210 | |
| 28 | 165 | |
| 30 | 130 | |
| 32 | 115 | |
| 34 | 100 | |
| 36 | 85 | |
| 38 | 70 | |
| 40 | 55 | |

Thus, we have provided a furnace system wherein the processed wafers are made to exit the furnace tubes at a lower temperature than heretofore possible. Since the wafers are now at a lower temperature when they enter the relatively cool scavenger zone, they are subject to less of a thermal stress resulting in fewer broken wafers thus increasing yields.

While we have described the process and shown the measured values involved with withdrawing a boat loaded with processed sapphire wafers, it should be obvious to those skilled in the art that similar data would be obtained (although slightly displaced) in a situation where a boat loaded with wafers is inserted into a system with no temperature gradient zone 14 as compared to inserting a boat loaded with sapphire wafers in a furnace system having a temperature gradient zone 14.

What is claimed is:

1. In a furnace system for processing silicon-on sapphire devices having a cabin for storing and supplying gases and reactants used in the processing of SOS wafers, a furnace abutting said cabinet and having at least one refractory reaction tube extending therethrough, one end of said tube communicating with the cabinet for receiving the gases and reactants and the other end terminating in a scavenger chamber whereby to exhaust residual gases and reactants, the scavenger chamber being spaced from the furnace, and a loading-unloading chamber whereby SOS loaded boats may be handled for movement seriatim through the loading-unloading chamber, the scavenger chamber, the refractory reaction tube extending between the spaced apart scavenger chamber and furnace, and into the furnace, the improvement comprising:

means providing a temperature gradient zone in said reaction tube extending between the scavenger chamber and the furnace;

said means including a refractory liner tube about the reaction tube and extending from the supply conduit to a predetermined intermediate section between the furnace and scavenger chamber; and a tubular member of predetermined thermally insulative quality overlying said refractory liner and reaction tubes and extending from the furnace wall to a further predetermined intermediate reaction tube section;

whereby, depending on process temperatures utilized, a predetermined temperature gradient is established in the reaction tube section outside of the furnace and whereby to inhibit the SOS wafers undergoing thermal shock.

2. The furnace system of claim 1 wherein:

a plurality of said reaction tubes and temperature gradient means is provided.

* * * * *

UNITED STATES PATENT AND TRADEMARK OFFICE
CERTIFICATE OF CORRECTION

PATENT NO. : 4,256,052

DATED : March 17, 1981

INVENTOR(S) : Raymond Verne Johnson et al.

It is certified that error appears in the above-identified patent and that said Letters Patent is hereby corrected as shown below:

Column 1, line 21, cancel "larger" and instead insert --large--.

Column 2, line 46, cancel "differenet" and instead insert --different--.

Column 3, line 2, cancel "wystem" and instead insert --system--.

Claim 1, line 2, cancel "cabin" and instead insert --cabinet--.

Signed and Sealed this

Second Day of June 1981

[SEAL]

Attest:

RENE D. TEGTMEYER

Attesting Officer

Acting Commissioner of Patents and Trademarks